US006589867B2

(12) United States Patent
Schuele et al.

(10) Patent No.: US 6,589,867 B2
(45) Date of Patent: *Jul. 8, 2003

(54) METHOD OF FABRICATING A CONTACT STRUCTURE HAVING A COMPOSITE BARRIER LAYER BETWEEN A PLATINUM LAYER AND A POLYSILICON PLUG

(75) Inventors: Paul J. Schuele, Boise, ID (US); Pierre C. Fazan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/944,436

(22) Filed: Aug. 31, 2001

(65) Prior Publication Data

US 2002/0004299 A1 Jan. 10, 2002

Related U.S. Application Data

(63) Continuation of application No. 09/535,050, filed on Mar. 24, 2000, now Pat. No. 6,313,031, which is a continuation of application No. 08/290,655, filed on Aug. 15, 1994, now Pat. No. 6,093,615.

(51) Int. Cl.⁷ ..................... H01L 21/4763; H01L 21/44
(52) U.S. Cl. ..................... 438/653; 438/627; 438/643; 438/684; 438/685; 438/688
(58) Field of Search .................. 438/688, 684, 438/622, 627, 637–640, 643, 644, 653, 654, 685

(56) References Cited

U.S. PATENT DOCUMENTS

| 5,089,438 A | 2/1992 | Katz |
| 5,136,362 A | 8/1992 | Grief et al. |
| 5,246,881 A | 9/1993 | Sandhu et al. |
| 5,252,518 A | 10/1993 | Sandhu et al. |
| 5,254,499 A | 10/1993 | Sandhu et al. |
| 5,258,096 A | 11/1993 | Sandhu et al. |
| 5,292,677 A | 3/1994 | Dennison |
| 5,335,138 A | 8/1994 | Sandhu et al. |
| 5,336,629 A | 8/1994 | Dhong et al. |
| 5,344,792 A | 9/1994 | Sandhu et al. |
| 5,353,246 A | 10/1994 | Tsang et al. |
| 5,381,302 A | 1/1995 | Sandhu et al. |
| 5,571,572 A | 11/1996 | Sandhu |
| 5,635,423 A | 6/1997 | Huang et al. |
| 6,107,105 A | * 8/2000 | Sandhu |

FOREIGN PATENT DOCUMENTS

JP  1-266718  10/1989

OTHER PUBLICATIONS

IBM Technical Disclosure Bulletin, vol. 35, No. 5, Oct. 1992 (Collimated Sputtering) pp. 456–459.

* cited by examiner

*Primary Examiner*—Ha Tran Nguyen
(74) *Attorney, Agent, or Firm*—TraskBritt

(57) ABSTRACT

This invention is a process for forming an effective titanium nitride barrier layer between the upper surface of a polysilicon plug formed in a thick dielectric layer and a platinum lower capacitor plate in a dynamic random access memory which is being fabricated on a silicon wafer.

22 Claims, 3 Drawing Sheets

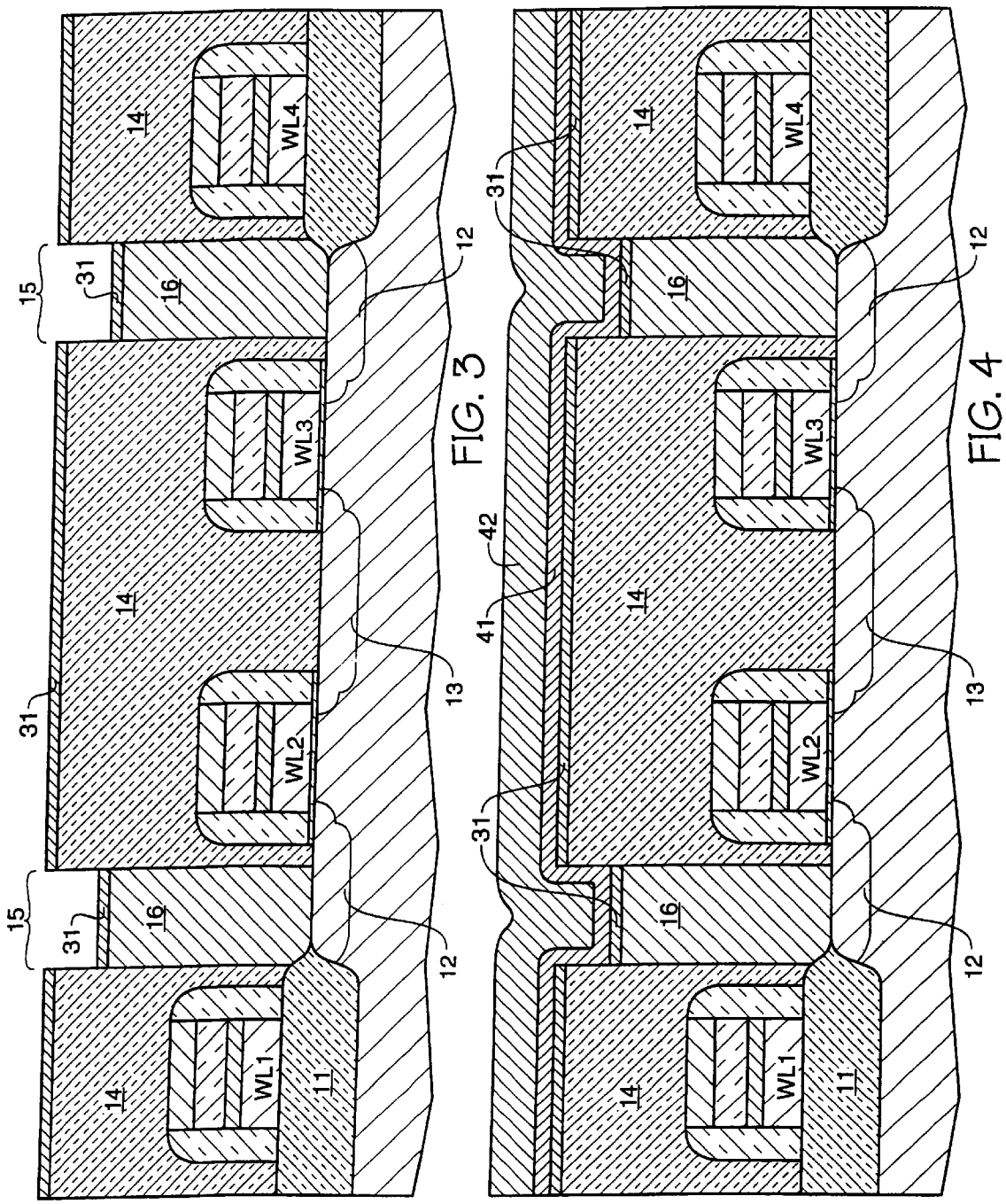

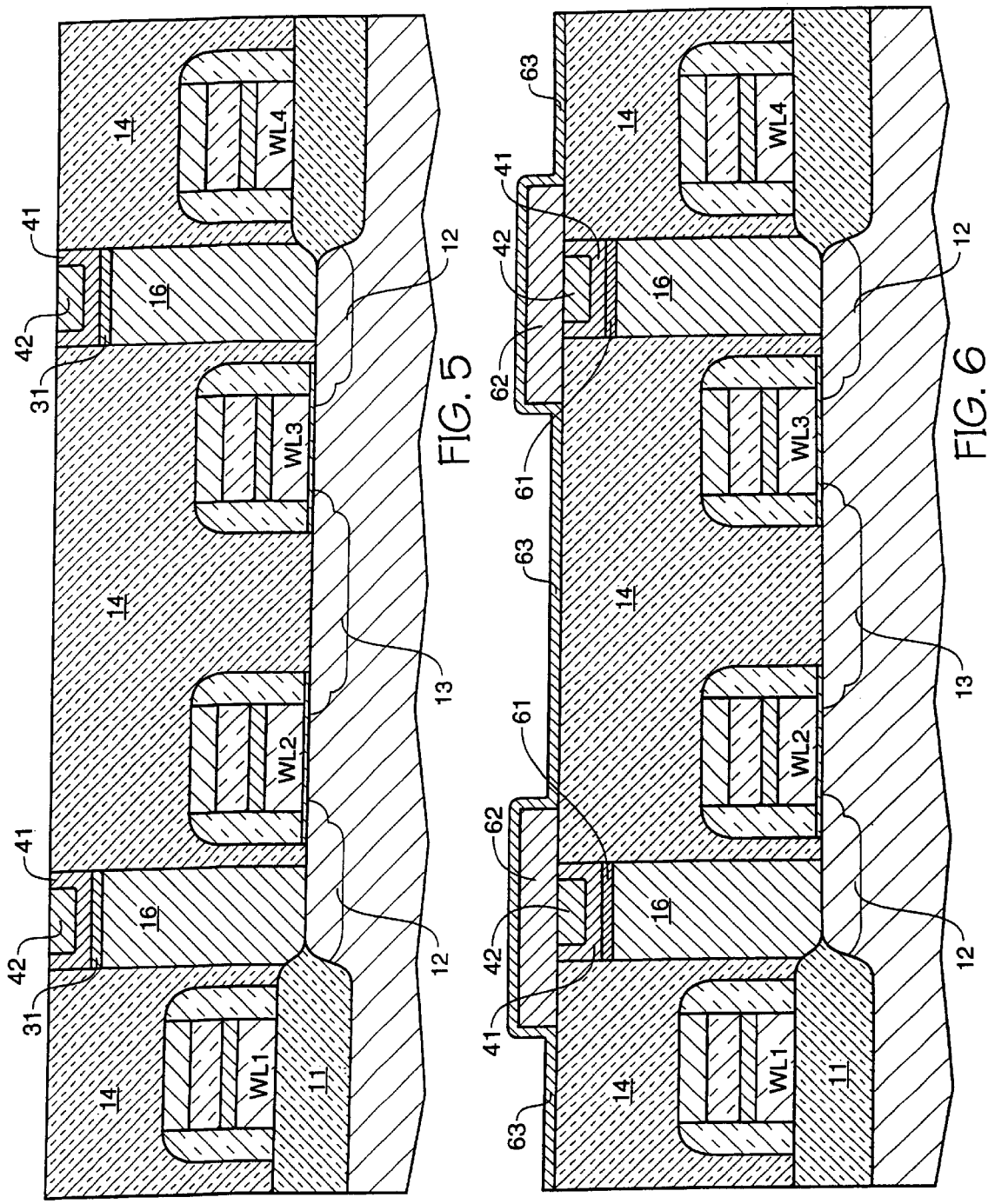

METHOD OF FABRICATING A CONTACT STRUCTURE HAVING A COMPOSITE BARRIER LAYER BETWEEN A PLATINUM LAYER AND A POLYSILICON PLUG

CROSS-REFERENCE TO RELATED APPLICATIONS

This application is a continuation of application Ser. No. 09/535,050, filed Mar. 24, 2000, now U.S. Pat. No. 6,313, 031 B1, issued Nov. 6, 2001, which is a continuation of application Ser. No. 08/290,655, filed Aug. 15, 1994, now U.S. Pat. No. 6,093,615, issued Jul. 25, 2000.

STATEMENT REGARDING FEDERALLY SPONSORED RESEARCH OR DEVELOPMENT

This invention was made with Government support under Contract No. MDA972-93-C-0033 awarded by Advanced Research Projects Agency (ARPA). The Government has certain rights in this invention.

BACKGROUND OF THE INVENTION

1. Field of the Invention

This invention relates to the manufacture of integrated circuits and, more specifically, to barrier films which are employed to prevent atomic and ionic migration between two adjacent layers which must be conductively coupled.

2. State of the Art

For a particular design of an ultra-high-density dynamic random access memory, the integration of a capacitor having a high-permittivity dielectric layer in a CMOS process flow requires that contact be made between a platinum lower capacitor plate and a polycrystalline silicon (polysilicon) plug which makes contact to the storage node junction of the cell access transistor. The dielectric layer, which may be a perovskite oxide such as barium strontium titanate, is deposited at high temperatures in ambient oxygen.

There are two problems inherent to the dielectric deposition process. The first problem is that the high temperature required for the deposition will initiate a silicidation reaction between platinum and silicon, thus consuming the platinum capacitor plate and contaminating the capacitor with silicon. It is, therefore, necessary to utilize an electrically conductive diffusion barrier between the platinum and the polysilicon. The second problem is that oxygen will diffuse through the platinum layer and form an insulative silicon dioxide layer between the polysilicon plug and the platinum layer. In such a case, the lower plate of the capacitor will not be in electrical contact with the storage-node junction. Thus, the diffusion barrier must also be impermeable to oxygen.

Reactively sputtered titanium nitride has been used extensively as a barrier layer in integrated circuits. However, reactively sputtered titanium nitride has a crystalline structure and does not exhibit good step coverage, particularly in deep contact openings. The crystal boundaries associated with such a structure tend to promote ionic and atomic migration. Given this fact, the polysilicon plugs will not be sufficiently protected from reaction with the platinum capacitor plate or with oxygen.

Titanium nitride deposited via low-pressure chemical vapor deposition (LPCVD) using tetrakis-dimethylamidotitanium or related compounds as the sole precursor is an amorphous material, having no crystal structure and, therefore, no crystal grain boundaries to facilitate atomic and ionic diffusion. However, titanium nitride films deposited via LPCVD have a high carbon content. From X-Ray spectrographic analysis, it appears that some of the carbon atoms have reacted with the titanium to form titanium carbide. The balance of the carbon atoms appears to be unreacted, but trapped, nevertheless, in the titanium nitride/titanium carbide matrix. It is hypothesized that a crystalline structure fails to form because the presence of carbon interferes with crystal nucleation. The presence of carbon, though likely responsible for the amorphous structure of the film (a beneficial quality), is also problematic, as it greatly increases the sheet resistance of the film. In addition, when the carbon-containing films are subjected to high temperatures in the presence of oxygen, the films become perforated and, hence, worthless as barrier films. The perforation phenomenon may be caused by the explosive formation of carbon dioxide gas within the film.

What is needed is a way to combine the beneficial qualities of both reactively-sputtered titanium nitride with those of titanium nitride deposited via LPCVD.

SUMMARY OF THE INVENTION

This invention is a process for forming an effective titanium nitride barrier layer between the upper surface of a polysilicon plug and a platinum lower capacitor plate in a dynamic random access memory. The memory, which is fabricated on a silicon wafer or substrate, has insulated gate field effect cell access transistors with polysilicon gates which may have a layer of a refractory metal silicide (e.g., tungsten silicide) on their upper surfaces to lower sheet resistance. The transistors are covered with a planarized, thick, flowably deposited dielectric layer such as borophosphosilicate glass (BPSG). A via or contact opening is etched through the thick dielectric layer (the term "thick" is employed merely to distinguish this dielectric layer from the subsequently deposited capacitive dielectric layer) to the storage-node junction of each access transistor, and each of these openings is filled with a polysilicon plug. To begin the barrier layer formation process, the upper surface of each polysilicon plug is recessed at least 1000 Å below the upper surface of the thick dielectric layer using a selective polysilicon etch. Using a collimated sputter source, a titanium layer having a thickness of 100–500 Å is deposited over the surface of the in-process wafer, thus covering the upper surfaces of the polysilicon plugs. A layer of amorphous titanium carbonitride having a thickness of 100–300 Å is then deposited via low-pressure chemical vapor deposition. This is followed by the deposition of a reactively sputtered titanium nitride layer having a thickness of 1000–2000 Å. The wafer is then planarized using chemical mechanical polishing (CMP) to remove the titanium, titanium carbonitride and titanium nitride, except that which is in the recesses on top of the silicon plugs. The wafer is then annealed in nitrogen using a rapid thermal anneal system to react the titanium layer with the silicon on the upper surfaces of the plugs to form titanium silicide. The anneal step also repairs damage sustained by the titanium nitride layer during the CMP step. A platinum layer is then deposited and patterned to form lower capacitor electrodes which are electrically coupled to the polysilicon plugs through the titanium silicide, titanium nitride and titanium carbonitride layers. A high permittivity capacitor dielectric layer is then deposited and the capacitors are completed by depositing an upper cell plate layer. The memory is then completed in a conventional manner.

BRIEF DESCRIPTION OF THE SEVERAL VIEWS OF THE DRAWINGS

FIG. 3 is a cross-sectional view of the portion of the in-process DRAM array of FIG. 2 following the deposition of a platinum metal layer;

FIG. 4 is a cross-sectional view of the portion of the in-process DRAM array of FIG. 3 following the formation of a titanium carbonitride layer via low-pressure chemical vapor deposition and the subsequent deposition of a titanium nitride layer via reactive sputtering;

FIG. 5 is a cross-sectional view of the portion of the in-process DRAM array of FIG. 4 following a planarization step; and FIG. 6 is a cross-sectional view of the portion of the in-process DRAM array of FIG. 5 following the deposition and patterning of a platinum metal layer and the subsequent deposition of a high-permittivity dielectric layer.

DETAILED DESCRIPTION OF THE INVENTION

Figure 1:
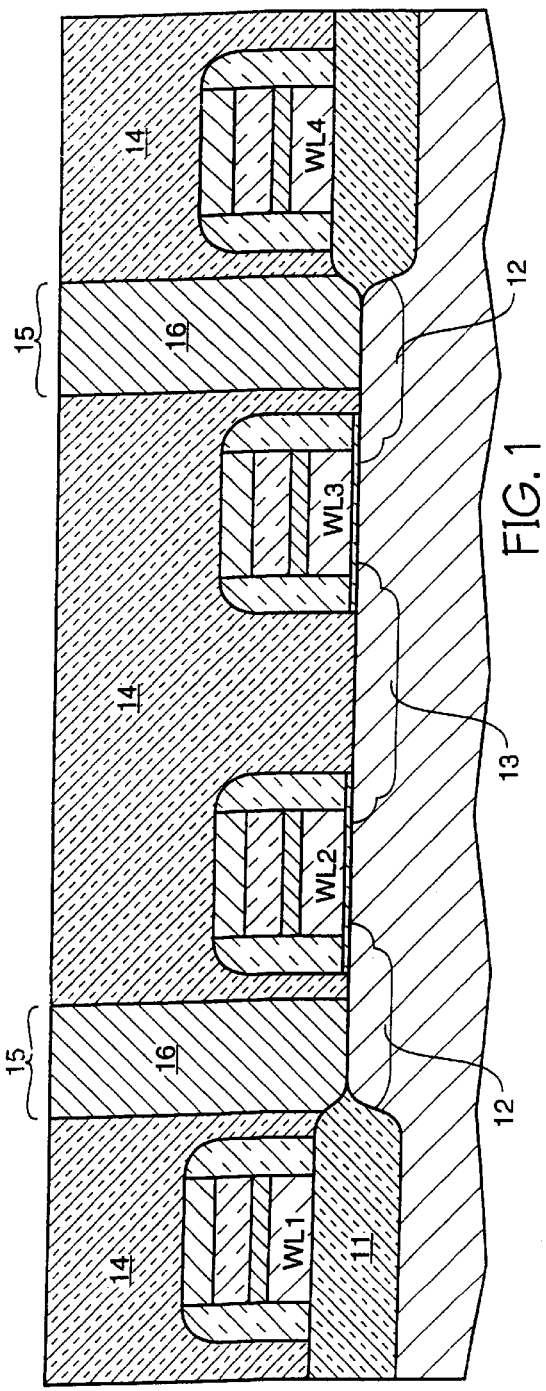
FIG. 1, a cross-sectional view of a portion of an in-process semiconductor wafer, depicts a portion of a dynamic random access memory (DRAM) array following field oxidation, wordline formation, source/drain implants, deposition of a thick dielectric layer, and polysilicon plug formation.

Referring now to FIG. 1, a portion of an in-process dynamic random access memory (DRAM) array is shown following a field oxidation step which formed field oxide regions 11, the deposition and patterning of a polysilicon layer to form wordlines WL1–WL4, source/drain implants which have formed storage-node junctions 12 and bit line contact junctions 13, the deposition of a thick, flowable dielectric layer (e.g., borophosphosilicate glass) 14 which covers substrate-superadjacent topography such as wordlines and field oxide regions, the formation of contact openings 15 in the thick dielectric layer 14 which expose the storage-node junctions 12, filling the contact openings 15 with polysilicon material, and planarization of the wafer to form polysilicon plugs 16.

Figure 2:
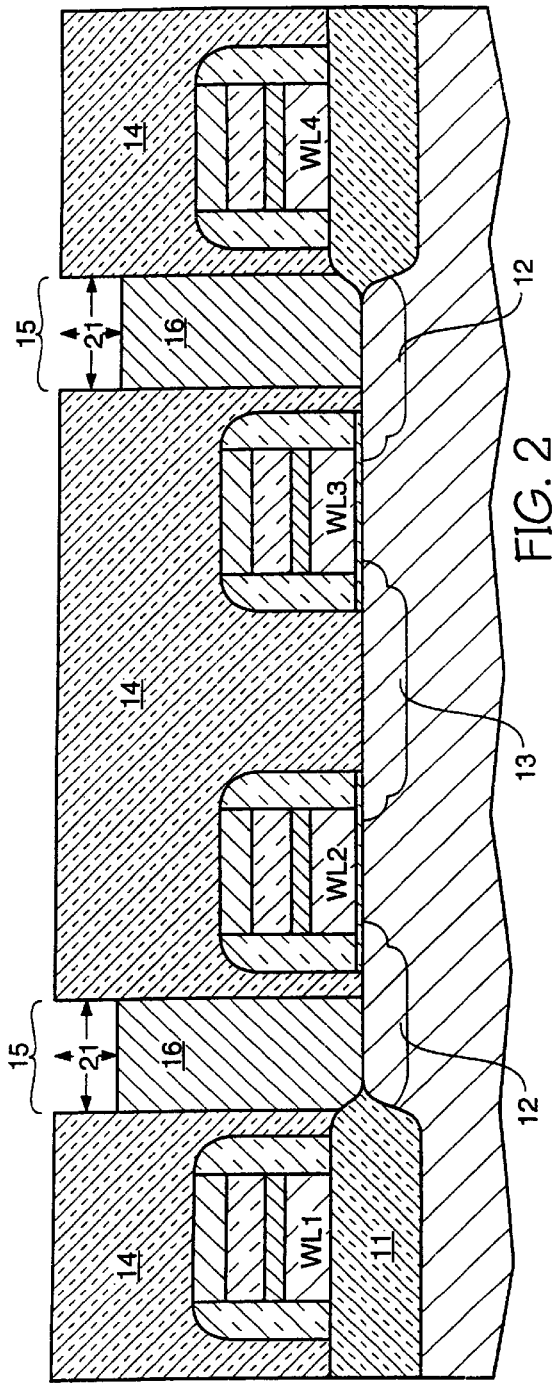
FIG. 2 is a cross-sectional view of the portion of the in-process DRAM array of FIG. 1 following an etch selective for polysilicon which has recessed the upper surface of each plug below the upper surface of the thick dielectric layer.

Referring now to FIG. 2, the polysilicon plugs 16 have been recessed within the contact openings 15 by performing an etch step that is selective for polysilicon, thus forming a well 21 in the thick dielectric layer 14 above each plug. The etch is allowed to proceed until the plugs are recessed at least 1000 Å below the upper surface of the thick dielectric layer 14.

Referring now to FIG. 3, a titanium metal layer 31 is deposited on the upper surface of the wafer to a thickness of 100–500 Å using a collimated sputter source.

Referring now to FIG. 4, a titanium carbonitride layer 41 having a thickness of 100–300 Å is deposited on the upper surface of the wafer via low-pressure chemical vapor deposition (LPCVD). Although the compound is referred to as titanium carbonitride (represented by the chemical formula $TiC_xN_y$), the stoichiometry of the compound is variable, depending on the conditions under which it is deposited. Its primary constituents are titanium and nitrogen, with the ratio of nitrogen to carbon being within a range of 5:1 to 20:1 for the process disclosed herein. X-Ray spectrographic analysis indicates that in these films, some of the carbon atoms have reacted with the titanium to form titanium carbide. The balance of the carbon atoms appear to be unreacted, but trapped, nevertheless, in the titanium nitride/titanium carbide matrix. It is hypothesized that a crystalline structure fails to form because the presence of carbon interferes with crystal nucleation.

Deposition of the titanium carbonitride layer 41 takes place in a low-pressure chamber (i.e. a chamber in which pressure has been reduced to between 0.1 and 100 Torr prior to deposition), and utilizes a metal-organic tetrakis-dialkylamido-titanium compound as the sole precursor. Any noble gas, as well as nitrogen or hydrogen, or a mixture of two or more of the foregoing, may be used as a carrier for the precursor compound. The wafer is heated to a temperature within a range of 200–600° C. Precursor molecules which contact the heated wafer are pyrolyzed to form titanium nitride containing variable amounts of carbon impurities, which deposits as a highly conformal film on the wafer. Although the carbon impurities present in the deposited films dramatically increase the sheet resistivity of the film, this increase in resistivity is relatively insignificant due to the relative thinness of the deposited layer. The carbon content of the barrier film may be minimized by utilizing tetrakis-dimethylamido-titanium, $Ti(NMe_2)_4$, as the precursor, rather than compounds, such as tetrakis-diethylamido-titanium or tetrakis-dibutylamido-titanium, which contain a higher percentage of carbon by weight.

Still referring to FIG. 4, the deposited titanium carbonitride layer 41 demonstrates excellent step coverage, a high degree of conformality, and an acceptable level of resistivity. Subsequent to the deposition of the titanium carbonitride layer 41, a titanium nitride layer 42 having a thickness of 1000–2000 Å is deposited on top of the titanium carbonitride layer 41 via reactive sputtering. Titanium nitride layers deposited via reactive sputtering normally do not exhibit good step coverage. Thus, most of the deposition occurs only on horizontal surfaces.

Referring now to FIG. 5, the wafer is planarized to remove the titanium, titanium carbonitride and titanium nitride, except that which is in the recesses on top of the polysilicon plugs 16.

Referring now to FIG. 6, the wafer has been subjected to an anneal step using a rapid thermal anneal system to react the titanium metal layer 31 (FIG. 3) with the silicon on the upper surfaces of the polysilicon plugs 16 to form titanium silicide layer 61. If the silicidation reaction is not allowed to proceed to completion, there will be a titanium metal layer on top of the titanium silicide layer 61. The anneal step also repairs damage sustained by the titanium nitride layer 42 during the CMP step. Subsequent to the anneal step, a platinum metal layer is deposited on the upper surface of the wafer and patterned to form lower capacitor electrodes 62. A high permittivity capacitor dielectric layer 63 is then deposited on the upper surface of the wafer. The capacitor dielectric layer 63, which may be a perovskite oxide such as barium strontium titanate or strontium titanate, is deposited at high temperatures in ambient oxygen. The titanium nitride layer 42 of the bi-layer barrier film that has been fabricated prevents oxygen from diffusing to the titanium carbonitride layer 41, where it would attack free carbon atoms and cause perforations in the barrier layer. Likewise, the titanium carbonitride layer 41, because it is an amorphous material without crystal grain boundaries, is able to prevent the migration of silicon atoms to the titanium nitride layer 42 through which it would be able to diffuse to reach the overlying platinum lower capacitor electrodes 62. The cell capacitors are completed by depositing an upper cell plate layer (not shown). The memory is then completed in a conventional manner.

Although only a single embodiment of the invention has been described in detail, it will be obvious to those having ordinary skill in the art of integrated circuit manufacture that changes and modifications may be made thereto without departing from the spirit and the scope of the invention as hereinafter claimed. For example, the invention may also be practiced in the context of a dynamic random access memory array having a buried bit line architecture, which bit lines (also known as digit lines) are formed after word line formation, but before cell capacitor formation. Thus, the general process flow depicted is meant to be only illustrative and not limiting.

What is claimed is:

1. A method for forming a barrier layer on a polysilicon plug in a dielectric layer of an integrated circuit comprising:

depositing a layer of titanium on the polysilicon plug;

depositing a layer of amorphous material on the layer of titanium; and depositing a layer of titanium nitride on the layer of amorphous material.

2. The method of claim 1, further comprising:

forming a recess in a portion of the polysilicon plug; and forming a well including a portion of the dielectric layer above the polysilicon plug;

depositing portions of the layer of titanium, the layer of amorphous material, and the layer of titanium nitride within the well and over at least a portion of a surface of the dielectric layer; and removing at least a portion of each of the layer of titanium, the layer of amorphous material, and the layer of titanium nitride deposited on the at least a portion of the surface of the dielectric layer.

3. The method of claim 2, wherein the removing the at least a portion of each of the layer of titanium, the layer of amorphous material, and the layer of titanium nitride deposited on the surface of the dielectric layer comprises planarizing the dielectric layer to remove at least the portions of the layer of titanium, the layer of amorphous material, and the layer of titanium nitride deposited on the at least a portion of the surface of the dielectric layer.

4. The method of claim 1, further comprising:

placing the dielectric layer of an integrated circuit in a low-pressure chemical vapor deposition chamber;

providing a carrier atmosphere in the low-pressure chemical vapor deposition chamber having a pressure in a range between about 0.1 Torr to about 100 Torr;

providing a precursor compound in the low-pressure chemical vapor deposition chamber; and heating the dielectric layer to a temperature in a range of between about 200° C. to about 600° C.

5. The method of claim 4, wherein the carrier atmosphere comprises a mixture including at least one gas selected from a group consisting of a noble gas, nitrogen and hydrogen.

6. The method of claim 4, wherein the precursor compound comprises an organo-metallic compound.

7. The method of claim 6, wherein the precursor compound comprises tetrakis-dialkylamido-titanium.

8. The method of claim 7, wherein the precursor compound comprises a sole precursor.

9. The method of claim 1, wherein the depositing the layer of amorphous material comprises depositing a layer of titanium carbonitride having an amorphous structure substantially without grain boundaries therein.

10. The method of claim 9, wherein the depositing the layer of titanium carbonitride comprises depositing a layer of titanium carbonitride having a ratio of carbon to nitrogen therein in the range of from about 1:5 to about 1:20.

11. The method of claim 1, wherein the depositing the layer of amorphous material comprises depositing a layer of substantially amorphous material substantially without crystal grain boundaries therein.

12. A method for forming a barrier layer over a polysilicon plug in at least a portion of dielectric layer of an integrated circuit comprising:

depositing a layer of titanium on at least a portion of the polysilicon plug;

depositing a layer of amorphous material on at least a portion of the layer of titanium; and depositing a layer of titanium nitride on at least a portion of the layer of amorphous material.

13. The method of claim 12, further comprising:

forming a recess in a portion of the polysilicon plug; and forming a well including a portion of the dielectric layer above and the recess in the polysilicon plug;

depositing portions of the layer of titanium, the layer of amorphous material, and the layer of titanium nitride within the well and over at least a portion of a surface of the dielectric layer; and removing at least a portion of each of the layer of titanium, the layer of amorphous material, and the layer of titanium nitride deposited on the at least a portion of the surface of the dielectric layer.

14. The method of claim 13, wherein the removing the at least a portion of each of the layer of titanium, the layer of amorphous material, and the layer of titanium nitride deposited on the surface of the dielectric layer includes planarizing the dielectric layer to remove at least the portions of the layer of titanium, the layer of amorphous material, and the layer of titanium nitride deposited on the at least a portion of the surface of the dielectric layer.

15. The method of claim 12, further comprising:

placing the dielectric layer of an integrated circuit in a low-pressure chemical vapor deposition chamber;

providing a carrier atmosphere in the low-pressure chemical vapor deposition chamber having a pressure in a range between about 0.1 Torr to about 100 Torr;

providing a precursor compound in the low-pressure chemical vapor deposition chamber; and heating the dielectric layer to a temperature in a range of between about 200° C. to about 600° C.

16. The method of claim 15, wherein the carrier atmosphere comprises a mixture including at least one gas selected from a group consisting of a noble gas, nitrogen and hydrogen.

17. The method of claim 15, wherein the precursor compound comprises an organo-metallic compound.

18. The method of claim 17, wherein the precursor compound comprises tetrakis-dialkylamido-titanium.

19. The process of claim 15, wherein the precursor compound comprises a sole precursor.

20. The method of claim 12, wherein the depositing the layer of amorphous material comprises depositing a layer of titanium carbonitride having an amorphous structure substantially without grain boundaries therein.

21. The method of claim 20, wherein the depositing the layer of titanium carbonitride comprises depositing a layer of titanium carbonitride having a ratio of carbon to nitrogen therein in the range of from about 1:5 to about 1:20.

22. The method of claim 12, wherein the depositing the layer of amorphous material comprises depositing a layer of substantially amorphous material substantially without crystal grain boundaries therein.

* * * * *